United States Patent [19]

Barrow et al.

[11] 4,023,102

[45] May 10, 1977

[54] TEST FIXTURE

[75] Inventors: William J. Barrow; Stephen M. Fromnick, both of Wilmington, Del.; Robert Mayer, Ardmore, Pa.

[73] Assignee: Sun Oil Company of Pennsylvania, Philadelphia, Pa.

[22] Filed: May 1, 1975

[21] Appl. No.: 573,698

[52] U.S. Cl. .......................... 324/158 F; 324/60 R; 324/62

[51] Int. Cl.² ................. G01R 27/00; G01R 31/00

[58] Field of Search ......... 324/158 F, 158 R, 60 R, 324/13, 62 R

[56] References Cited

UNITED STATES PATENTS

| | | | |
|---|---|---|---|
| 2,472,814 | 6/1949 | Elliott | 324/60 R |
| 2,906,948 | 9/1959 | Shawhan | 324/60 R |

*Primary Examiner*—Robert Segal
*Assistant Examiner*—Ernest F. Karlsen
*Attorney, Agent, or Firm*—J. Edward Hess; Donald R. Johnson; William C. Roch

[57] ABSTRACT

A test fixture designed to measure selected electrical parameters of a wax which is utilized as a dielectric in telephone transmission lines. The test fixture is mounted on top of and plugged directly into a commercially available Q (quality factor) meter. A high Q coil is also mounted on top of and plugged directly into the Q meter. A T-shaped ground shield plate separates the test fixture from the coil, and also covers the front of both components to shield them from stray capacitance and interference from operator proximity and system configuration.

10 Claims, 4 Drawing Figures

TEST FIXTURE

BACKGROUND OF THE INVENTION

The present invention relates generally to a test fixture for measuring selected electrical parameters of a test substance, and more particularly pertains to a test fixture designed to aid in the accurate measurement of the quality factor (Q), dissipation factor (D) and dielectric constant ($K_s$) of a wax which is utilized as a dielectric in telephone transmission cables. A cable wax having a low D and high $K_s$ will minimize cross talk between adjacent wires in a transmission cable. The designed use of the present invention is the verification of these measured electrical parameters after manufacture of the wax.

SUMMARY OF THE INVENTION

In accordance with preferred embodiment, a test fixture is disclosed for allowing an accurate measurement of selected electrical parameters of a sample of material. The test fixture includes an electrically and mechanically stable base. The base supports an electrically conductive base plate which receives on its top surface an electrically conductive sample receptacle containing a sample of the material being tested. An electrically conductive top plate is placed over the sample of material in the receptacle such that the top plate and sample receptacle form a substantially parallel plate capacitor assembly with the sample material being disposed as a dielectric material therein. The base also supports a bridge which is electrically insulated from the conductive base plate and which allows a stable electrical contact to be made with the top plate of the capacitor assembly.

The test fixture of the present invention allows an immediate and accurate measurement of particular electrical parameters of a test material. Further, the test fixture provides: good electrical connections of the capacitor assembly to the measurement circuit; accurate repeatable positioning of the capacitor assembly in the test fixture; accurate repeatability of measurements and elimination of many extraneous causes of measurement error. The test fixture allows the capacitor assembly to be inserted into or taken out of the circuit without having to connect or disconnect leads or change other physical arrangements which might change circuit parameters and result in errors in the measurement.

BRIEF DESCRIPTION OF THE DRAWING

Referring to FIG. 1, there is illustrated a perspective view of a standard commercially available Q meter 10, such as Model 4342A from Hewlett Packard. The Q meter has one embodiment of the test fixture 12 of the present invention mounted on one side of the top of its console and a high Q coil 14 mounted on the other side of the top of its console.

FIG. 2 illustrates broadly the circuit in a Q meter. As is known in the art, a Q meter consists of a stable, continuously variable oscillator 16, the automatically level controlled output of which is applied in series with a tuned resonant circuit. The tuned resonant circuit includes the high Q coil 14 which is shown in FIG. 1, a variable capacitor 18 within the console of the Q meter, the capacitance ($C_t$) of the test fixture 12 shown in FIG. 1, and the capacitance ($C_x$) of a parallel plate capacitor assembly positioned within the test fixture. The Q meter further includes a Q voltmeter 19 having a high input impedance and which is connected across the variable capacitor 18 to measure the reactive voltage. The theory of a Q meter will not be explained further herein as it is a commercially available instrument, and is used in a standard manner with the present invention.

FIG. 3 illustrates a receptacle 20 for the wax sample and a top plate 22 which is placed on top of the wax sample as shown. The top plate 22 includes a dome shaped contact 23 for a purpose which will be explained later. The sample receptacle 20 includes a lip 24 around its circumference which is approximately 0.050 inches high. The wax to be tested is poured into the receptacle up to the top of the lip to form a layer of wax approximately 0.050 inches thick. The top plate 22 is then placed on top of the wax such that the sample receptacle and the top plate form a substantially parallel plate capacitor assembly with the sample material being disposed as a dielectric material therein. The thickness of the wax sample must be measured accurately for a later determination of all desired electrical properties. This may be done by measuring the thickness of the capacitor assembly with a dial gage, and then subtracting the thickness of the top plate and sample receptacle base which are known.

Figure 1:
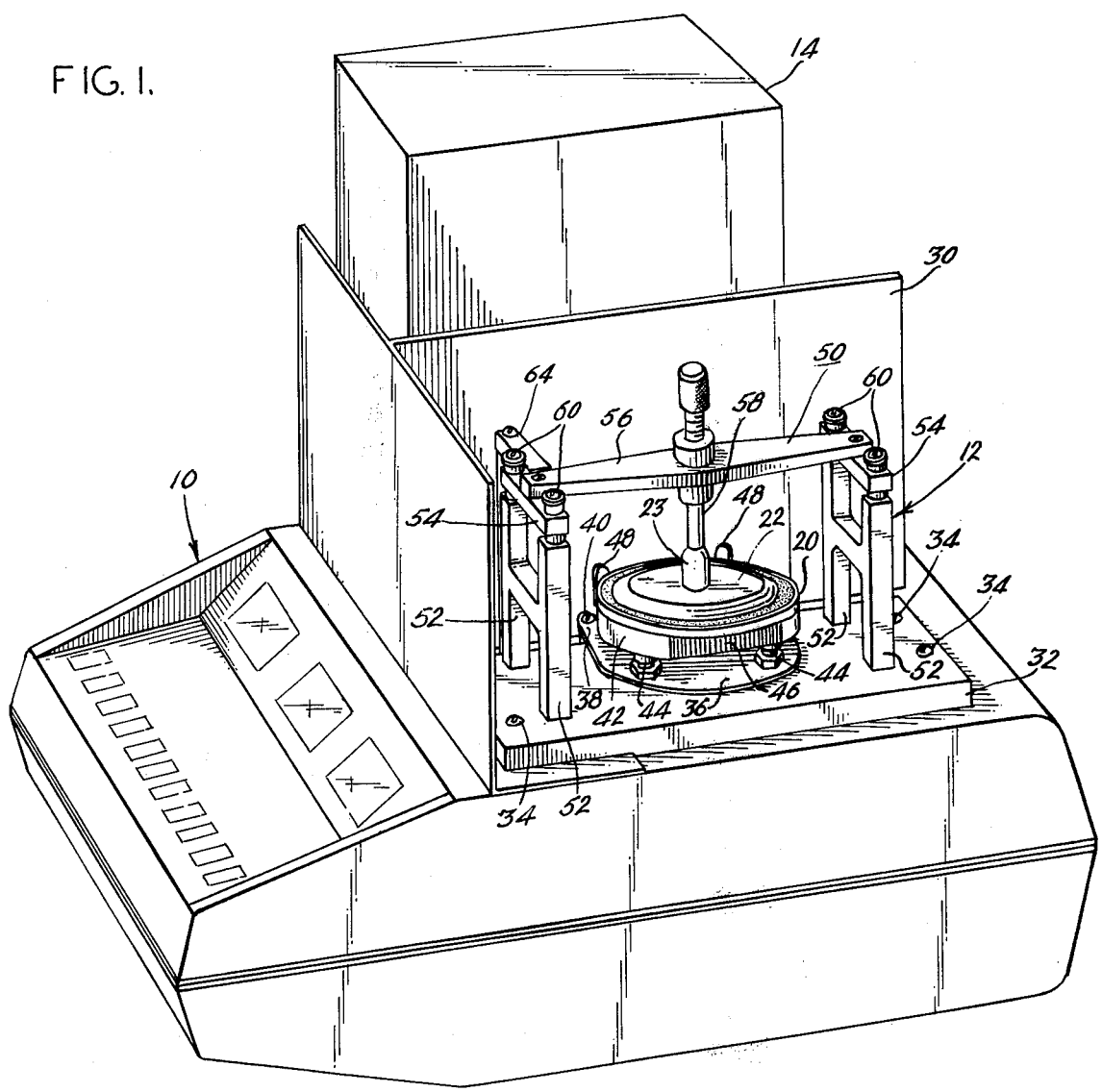
FIG. 1 is a perspective view of a commercially available Q meter having a coil and one embodiment of the test fixture of the present invention mounted thereon.
Figure 4:
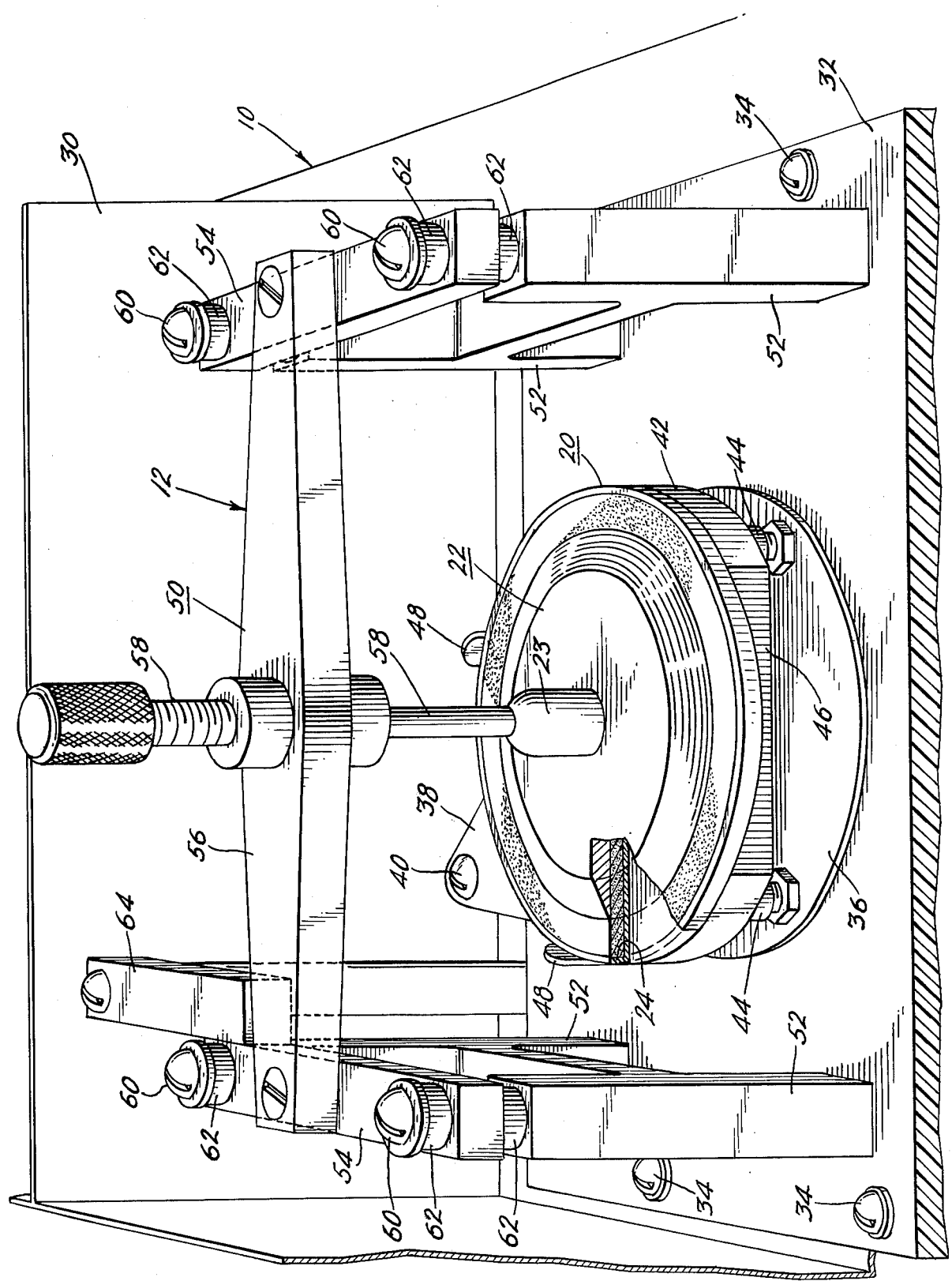
FIG. 4 is a perspective view of one embodiment of the test fixture with a sample of wax positioned therein.

The capacitor assembly is then placed within the test fixture, as shown in more detail in FIGS. 1 and 4. Referring to those figures, the test fixture 12 and the high Q coil 14 are mounted directly on top of the Q meter console and are plugged directly into the Q meter via bayonet type electrical connections. The test fixture 12 and coil 14 are separated from each other by a T-shaped ground shield plate 30 which also covers the front of those components, and which acts to shield the components from stray capacitance and interference due to operator proximity and system configuration.

Figure 3:
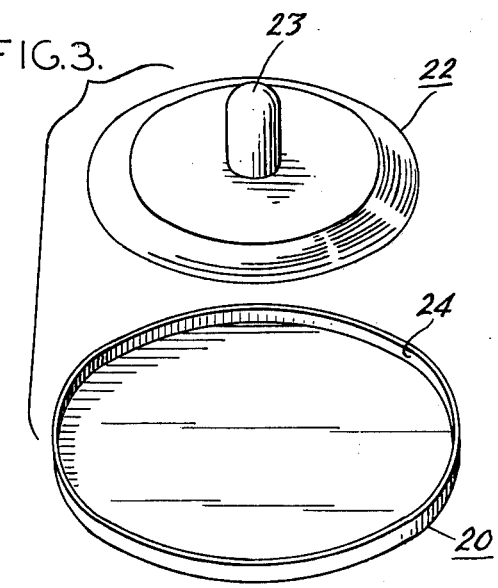
FIG. 3 illustrates the receptacle for the wax sample and the top plate which is placed on top of the wax sample.
Figure 2:
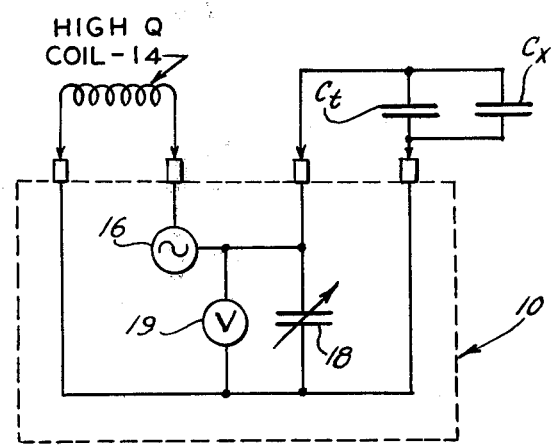
FIG. 2 is an electrical diagram showing broadly the circuit of a Q meter, and how the test fixture and wax sample are connected therein.

The test fixture 12 consists of a thick Micalex base 32 which is screwed directly onto the top of the Q meter by four screws 34. The base 32 forms a stable foundation for the remainder of the test fixture. An electrically conductive plate 36 is supported directly on the base 32, and includes an offset section 38 which has a screw connection 40 which forms a direct electrical connection with the Q meter. The electrically conductive plate 36 supports an electrically conductive base plate 42 in an elevated position by three legs 44. The electrically conductive base plate 42 is substantially circular, but has a portion removed at 46 to allow the capacitor assembly shown in FIG. 3 to be easily placed thereon or removed therefrom. The base plate 42 further includes two positioning pieces 48 spaced around its circumference such that the capacitor assembly may be placed on top of the conductive base plate with its circumference positioned against the two positioning pieces, which results in an accurate alignment of the capacitor assembly within the test fixture. The base 32 also supports a bridge assembly 50 which includes four corner legs 52 which support substantially horizontal end pieces 54. A cross piece 56 extends between the two end pieces, and supports a screw contact 58 which may be screwed into and out of contact with the dome shaped contact 23 of the top plate. The end pieces 54 and cross piece 56 are electrically insulated from the legs 52 as follows. Each corner connection includes a corner bolt 60 and two cylindrical quartz spacers 62 which are placed within counterbored sections of the end pieces 54 and corner legs 52 to maintain all the components in stable alignment. The quartz spacers also serve to insulate the end pieces 54 from the corner legs 52. An L-shaped electrical connector 64 is bolted to one of the end pieces 54, and extends downward to the Q meter console. The connector 64 forms a direct electrical connection with the Q meter via a screw connection at its lower end.

With this structure, the sample receptacle 20, which forms the lower plate of the capacitor assembly, is connected to the Q meter via electrically conductive base plate 42, legs 44, electrically conductive plate 36 and screw connection 40. Likewise, the top plate 22, which forms the second plate of the parallel plate capacitor assembly, is connected with the Q meter via screw contact 58, cross piece 56, end piece 54 and L-shaped connector 64. In the preferred embodiment all electrically conductive components are gold coated to function as good electrical conductors for relatively high frequency electrical energy, and also to prevent any corrosion of the parts.

As illustrated in FIGS. 1 and 4, the test fixture is constructed in a sturdy manner to form a mechanically and electrically stable fixture for electrical measurements. The fixture provides stable electrical connections of the capacitor assembly to the Q meter, accurate repeatable positioning of the capacitor assembly in the test fixture, accurate repeatability of measurements, and elimination of many extraneous causes of measurement error such as might be caused by the changed position of wires, etc.

The desired apparatus may be utilized to determine the desired electrical properties as follows. In the following procedure, multiple measurements are taken to increase the accuracy of the measurements.

Preheat three sample receptacles to 100° C. Melt the wax sample in a glass beaker at a temperature high enough to make the sample completely fluid. Using water at 100° C is adequate. To ensure uniformity, stir the sample gently while being careful to produce no air bubbles. Place the three preheated sample receptacles on a level base. Gently pour the wax sample brim full into the sample receptacles while being careful to produce no air bubbles. Allow to cool slowly to room temperature. After the sample has cooled to room temperature centrally place a top plate on top of the wax sample. Be sure this plate is located in the center of the wax (by eye) and then press the top plate firmly in place. Be firm but do not crush the wax sample. The sample is now ready to be measured.

Measure the thickness of each capacitor assembly at several locations and average the readings. These measurements may be taken with a dial indicator gage, as for example one sold by Starrett Company. If there is a variation of more then 0.005 inch between the minimum and maximum thickness as of the sample, discard the wax and pour a new level sample. Subtract the top plate thickness and dish thickness from the total thickness measured. The result is the average thickness of the wax sample.

The measurements for the capacitor assemblies are to be taken at two different frequencies; 100 KHZ and 1000 KHZ. This is accomplished by operating the Q meter with a different precision reference coil at each frequency. By way of example, the high Q reference coils may be purchased from Rutherford Company. The measurement at each frequency consists of the following steps. Lift the probe approximately 0.050 inch off of the dome contact of the capacitor assembly. This causes the capacitance of the test fixture to be included into the circuit of the Q meter, but does not connect $C_x$ into the circuit. Next bring the circuit of the Q meter to resonance by adjusting the internal variable capacitor, and record the value of the internal capacitor and the Q indicated by the Q meter. These measured values are hereinafter referred to as $C_{50}$ and $Q_{50}$. After recording the value of $C_{50}$ and $Q_{50}$, the probe is brought into contact with the dome contact of the capacitor assembly. This causes $C_x$ to be included in the resonant circuit. Since the test fixture capacitance remains constant, the only change in the circuit is the additional capacitance of $C_x$. The circuit is then brought to resonance again by adjusting the internal capacitor, and the readings of the internal capacitor and the Q of the Q meter are again recorded. These readings are hereinafter referred to as $C_t$ and $Q_t$.

These readings are then combined in the following equation to determine $Q_x$, the quality factor of the capacitor assembly.

$$Q_x = \frac{C_{50} - C_t}{C_{50}} \times \frac{Q_{50} \times Q_t}{Q_{50} - Q_t}$$

The dissipation factor ($D_x$) of the capacitor assembly is the inverse of $Q_x$ or $D_x = 1/Q_x$ In determining the dielectric constant $K_s$ of the wax sample, the information already obtained is utilized along with physical dimensions of the test sample.

The diameter of the top plate is d, and the thickness of the sample is t. The dielectric constant of the sample $K_s$ may then be determined as follows.

$$K_s = \frac{C_{50} - C_t + .077\,\pi\,(d+t)\,\log t - .045\,\pi\,(d+t)}{(.06954\,d^2/t + .041\,(d+t))}$$

Although at least one embodiment of the present invention has been described, the teachings of this invention will suggest many other embodiments to those skilled in the art. Also, although the disclosed example measures the electrical parameters of wax, the system might be utilized to test other types of materials. Further, the test fixture of the present invention might be utilized for other types of electrical measurements.

The invention claimed is:

1. A test fixture for allowing an accurate measurement of selected electrical parameters of a sample of material being tested in the fixture and comprising:
   a. a base means for providing an electrically and mechanically stable base for the test fixture;
   b. an electrically conductive base plate means, supported by said base means, for receiving on its top surface a sample receptacle containing a sample of the material being tested;

c. a sample receptacle for holding a sample of the material being tested, said sample receptacle being electrically conductive and being adapted to be positioned directly on and make direct electrical contact with said electrically conductive base plate means;

d. an electrically conductive top plate adapted to be placed directly over a sample of material in said sample receptacle, and in which position said top plate and said sample receptacle form a substantially parallel plate capacitor with the sample material being disposed as a dielectric material between said top plate and said sample receptacle;

e. bridge means, supported by said base means and electrically insulated from said conductive base plate means, for allowing a stable electrical contact to be made with said top plate, whereby the test fixture provides a mechanically and electrically stable environment in which a sample of material being tested may be placed as the dielectric material in a substantially parallel plate capacitor and selected electrical parameters of the sample material may be measured.

2. A test fixture as set forth in claim 1 in which said sample receptacle and said top plate are both substantially circular, and said conductive base plate means is also substantially circular but with a side portion removed to allow the sample receptacle to be grasped while on the base plate means so that it may be easily placed on or removed from the base plate means.

3. A test fixture as set forth in claim 1 wherein said test receptacle, said top plate, and said base plate means are all substantially circular, and said base plate means includes two positioning pieces extending upward from its circumference such that the circumference of said test receptacle may be placed in contact with and adjacent to said positioning pieces and result in an accurate positioning of said test receptacle in the test fixture.

4. Apparatus as set forth in claim 1 and further including an electrical shield means partially surrounding said test fixture to more completey electrically insulate the test fixture from the environment around the test fixture.

5. A test fixture as set forth in claim 1 wherein said conductive base plate means, said sample receptacle, said top plate, and said bridge means are all gold coated to function as good electrical conductors for relatively high frequency electrical energy.

6. A test fixture as set forth in claim 1 wherein said bridge means includes an adjustable connector which may be raised or lowered into direct electrical contact with said top plate.

7. A test fixture as set forth in claim 1 wherein the test fixture is adapted to be placed directly upon a Q meter and wherein:

a. said electrically conductive base plate means includes means for providing a direct elecrical connection with the Q meter; and b. said bridge means includes means for providing a direct electrical connection with the Q meter;

8. A test fixture as set forth in claim 7 and further including an electrical shield means partially surrounding said test fixture to more completely electrically insulate the test fixture from the environment around the test fixture.

9. A test fixture as set forth in claim 8 wherein said test receptacle, said top plate, and said base plate means are all substantially circular, and said base plate means includes two positioning pieces extending upward from its circumference such that the circumference of said test receptacle may be placed in contact with and adjacent to said positioning pieces and result in an accurate positioning of said test receptacle in the test fixture.

10. A test fixture as set forth in claim 9 wherein said conductive base plate means, said sample receptacle, said top plate, and said bridge means are all gold coated to function as good electrical conductors for relatively high frequency electrical energy.

* * * * *